United States Patent
Lee

(10) Patent No.: US 12,315,800 B2
(45) Date of Patent: May 27, 2025

(54) SEMICONDUCTOR CHIP WITH FUSE STRUCTURE IN SCRIBE LANE AND METHOD OF FABRICATING THE SAME

(71) Applicant: Samsung Electronics Co., Ltd., Suwon-si (KR)

(72) Inventor: Donghwa Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 420 days.

(21) Appl. No.: 17/851,170

(22) Filed: Jun. 28, 2022

(65) Prior Publication Data

US 2023/0178484 A1 Jun. 8, 2023

(30) Foreign Application Priority Data

Dec. 2, 2021 (KR) .................. 10-2021-0170933

(51) Int. Cl.
*H01L 23/525* (2006.01)
*G11C 17/16* (2006.01)
*H01L 21/768* (2006.01)
*H01L 23/544* (2006.01)

(52) U.S. Cl.
CPC .......... *H01L 23/5256* (2013.01); *G11C 17/16* (2013.01); *H01L 21/76838* (2013.01); *H01L 23/544* (2013.01); *H01L 2223/5446* (2013.01)

(58) Field of Classification Search
CPC .............. G06F 30/392; H01L 27/0207; H01L 27/0211; H01L 2223/5446; H01L 23/5256; G11C 17/16; H10B 20/25
See application file for complete search history.

(56) References Cited

U.S. PATENT DOCUMENTS

| 6,594,818 B2 | 7/2003 | Kim et al. |
| 6,825,511 B2 | 11/2004 | Song et al. |
| 10,438,681 B2 | 10/2019 | Kim |
| 10,923,483 B2 | 2/2021 | Chang et al. |
| 2002/0136046 A1 * | 9/2002 | Kim ............... H01L 27/0207 257/E21.602 |

(Continued)

FOREIGN PATENT DOCUMENTS

| CN | 103000614 A * | 3/2013 |
| EP | 1244147 A1 | 9/2002 |

(Continued)

*Primary Examiner* — John P. Dulka
(74) *Attorney, Agent, or Firm* — HARNESS, DICKEY & PIERCE, P.L.C.

(57) ABSTRACT

Disclosed is a method of designing and fabricating a semiconductor chip including a fuse cell. The method may include preparing a semiconductor chip layout, the semiconductor chip layout including a main chip layout and a scribe lane layout enclosing the main chip layout; disposing a fuse layout in the scribe lane layout; setting the main chip layout as a first data preparation region; setting the scribe lane layout and the fuse layout as a second data preparation region; obtaining a first resulting structure and a second resulting structure, respectively, by performing a data preparation process on the first and second data preparation regions; merging the first and second resulting structures to generate mask data; manufacturing a photomask, based on the mask data; and forming semiconductor chips on a wafer using the photomask.

20 Claims, 18 Drawing Sheets

(56) References Cited

U.S. PATENT DOCUMENTS

2003/0062591 A1    4/2003  Jensen et al.
2011/0272692 A1  11/2011  Han et al.
2014/0151699 A1*  6/2014  Wu ......................... H01L 22/34
                                                                                             257/48

FOREIGN PATENT DOCUMENTS

| GB | 2332981 A | | 7/1999 |
|----|-----------|---|--------|
| JP | H09311432 A | * | 12/1997 |
| KR | 20020040446 A | | 5/2002 |
| KR | 20050064768 A | * | 6/2005 |
| KR | 20090088671 A | | 8/2009 |
| KR | 2010/0010841 A | | 2/2010 |

* cited by examiner

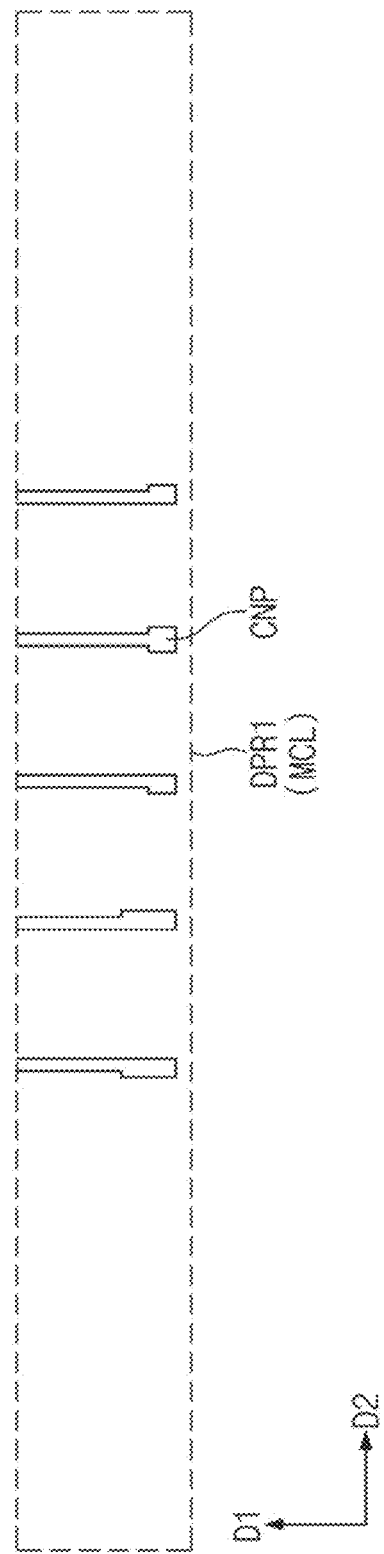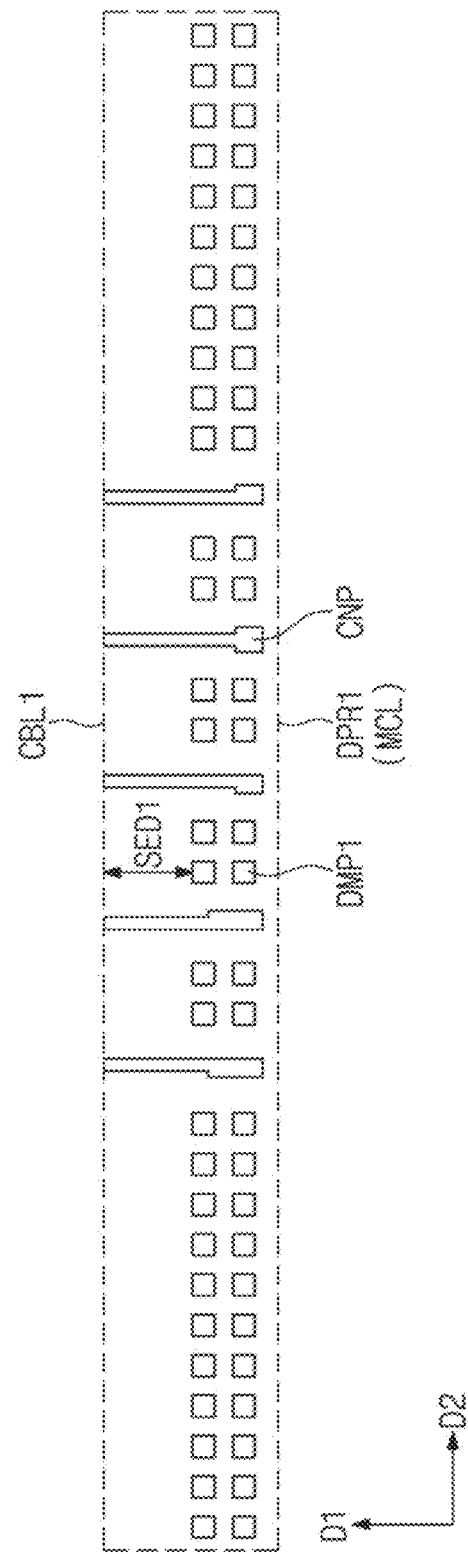

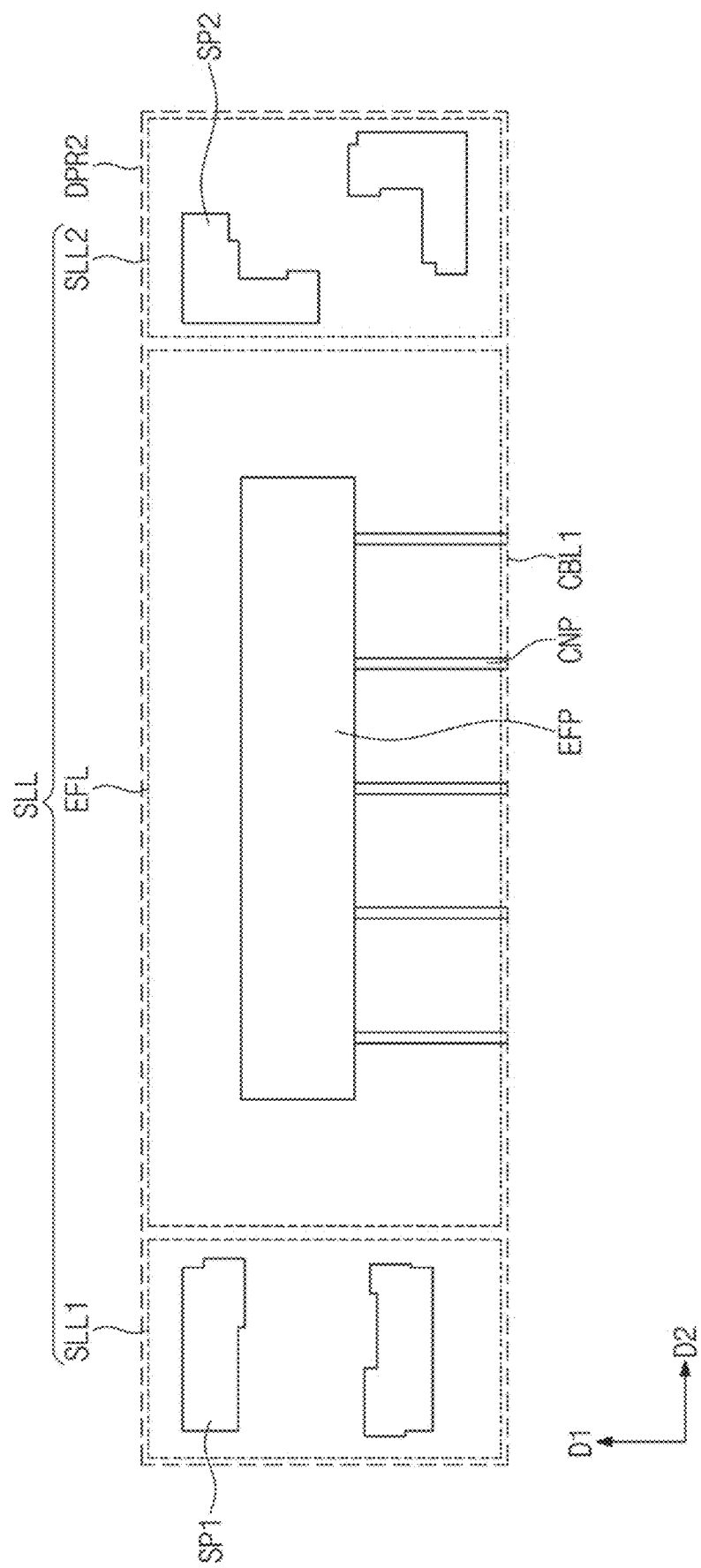

SEMICONDUCTOR CHIP WITH FUSE STRUCTURE IN SCRIBE LANE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0170933, filed on Dec. 2, 2021 in the Korean Intellectual Property Office, the entire contents of which are hereby incorporated by reference.

BACKGROUND

The present disclosure relates to a method of designing and fabricating a semiconductor chip including a fuse cell.

Due to their small-sized, multifunctional, and/or low-cost characteristics, semiconductor devices are being esteemed as important elements in the electronics industry. The semiconductor devices are classified into a semiconductor memory device for storing data, a semiconductor logic device for processing data, and a hybrid semiconductor device including both memory and logic elements. As the electronic industry advances, there may be more demand for semiconductor devices with improved characteristics. For example, there may be more demand for semiconductor devices with high reliability, high performance, and/or multiple functions. To meet this demand, structural complexity and/or integration density of semiconductor devices are being increased.

SUMMARY

An embodiment of inventive concepts provides a method of fabricating a semiconductor chip with improved security.

An embodiment of inventive concepts provides a method of increasing the number of net dies formed on a wafer, when a semiconductor chip is fabricated.

According to an embodiment of inventive concepts, a method of fabricating a semiconductor chip may include preparing a semiconductor chip layout, the semiconductor chip layout including a main chip layout and a scribe lane layout enclosing the main chip layout; disposing a fuse layout in the scribe lane layout; setting the main chip layout as a first data preparation region; setting the scribe lane layout and the fuse layout as a second data preparation region; obtaining a first resulting structure and a second resulting structure, respectively, by performing a data preparation process on the first data preparation region and the second data preparation region; merging the first resulting structure and the second resulting structure to generate mask data; manufacturing a photomask, based on the mask data; and forming semiconductor chips on a wafer using the photomask.

According to an embodiment of inventive concepts, a method of fabricating a semiconductor chip may include forming semiconductor chips on a wafer, each of the semiconductor chips including a main chip including a first portion of a connection structure, a scribe lane on a first boundary of the main chip, and a fuse cell in the scribe lane; testing functional elements in the main chip through the fuse cell; and dicing the wafer to separate the semiconductor chips from each other to provide a plurality of separated semiconductor chips. The fuse cell may include a fuse structure and a second portion of a connection structure. The connection structure may extend from the fuse structure into the main chip. The dicing the wafer may include removing the fuse structure. Each separated semiconductor chip among the plurality of separated semiconductor chips may include a cut portion of the connection structure.

According to an embodiment of inventive concepts, a semiconductor chip may include a main chip; a cut scribe lane on a first boundary of the main chip; a cut fuse cell in the cut scribe lane; and a connection structure extending from the cut fuse cell into the main chip. The main chip may include first dummy structures disposed around the connection structure. The cut fuse cell may include second dummy structures disposed around the connection structure. The main chip and the cut fuse cell may define a dummy-free region between the first dummy structures and the second dummy structures. The dummy-free region may overlap the first boundary.

BRIEF DESCRIPTION OF THE DRAWINGS

FIGS. 5 to 11 are schematic diagrams illustrating a method of performing a data preparation process on the layout of FIG. 4.

FIG. 14A illustrates a circuit diagram of an electrical fuse (e-fuse), and FIG. 14B illustrates a structure of the e-fuse.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Example embodiments of inventive concepts will now be described more fully with reference to the accompanying drawings, in which example embodiments are shown.

Figure 1:
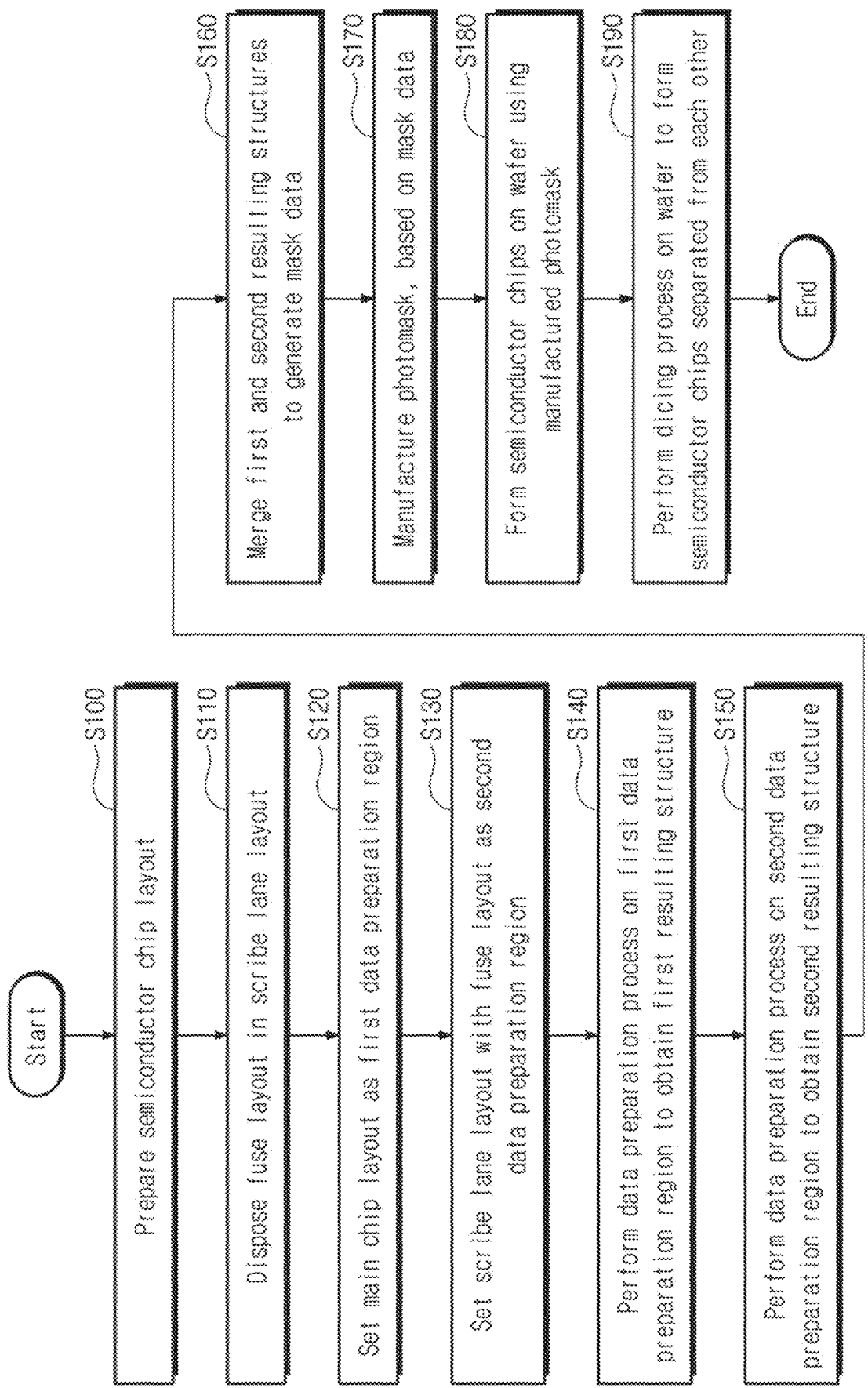
FIG. 1 is a flow chart illustrating a method of designing and fabricating a semiconductor chip according to an embodiment of inventive concepts.

FIG. 1 is a flow chart illustrating a method of designing and fabricating a semiconductor chip according to an embodiment of inventive concepts. FIGS. 2 to 16 are schematic diagrams illustrating the designing and fabricating method of FIG. 1. For example, the semiconductor chip according to the present embodiment may include a Micro Computing Unit (MCU).

Figure 2:
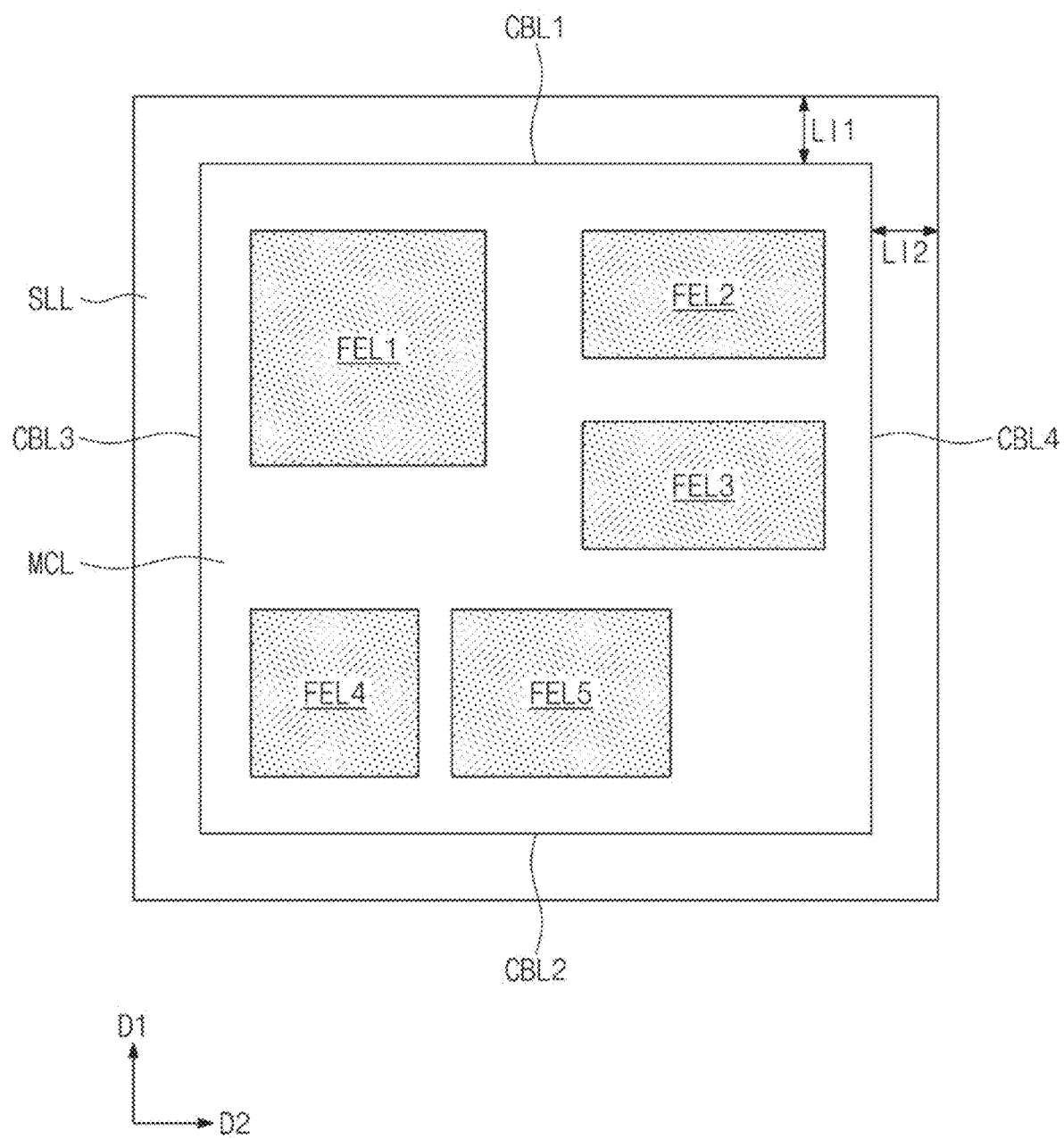
FIGS. 2 and 3 are schematic diagrams, each of which illustrates a semiconductor chip layout according to an embodiment of inventive concepts.
Figure 3:
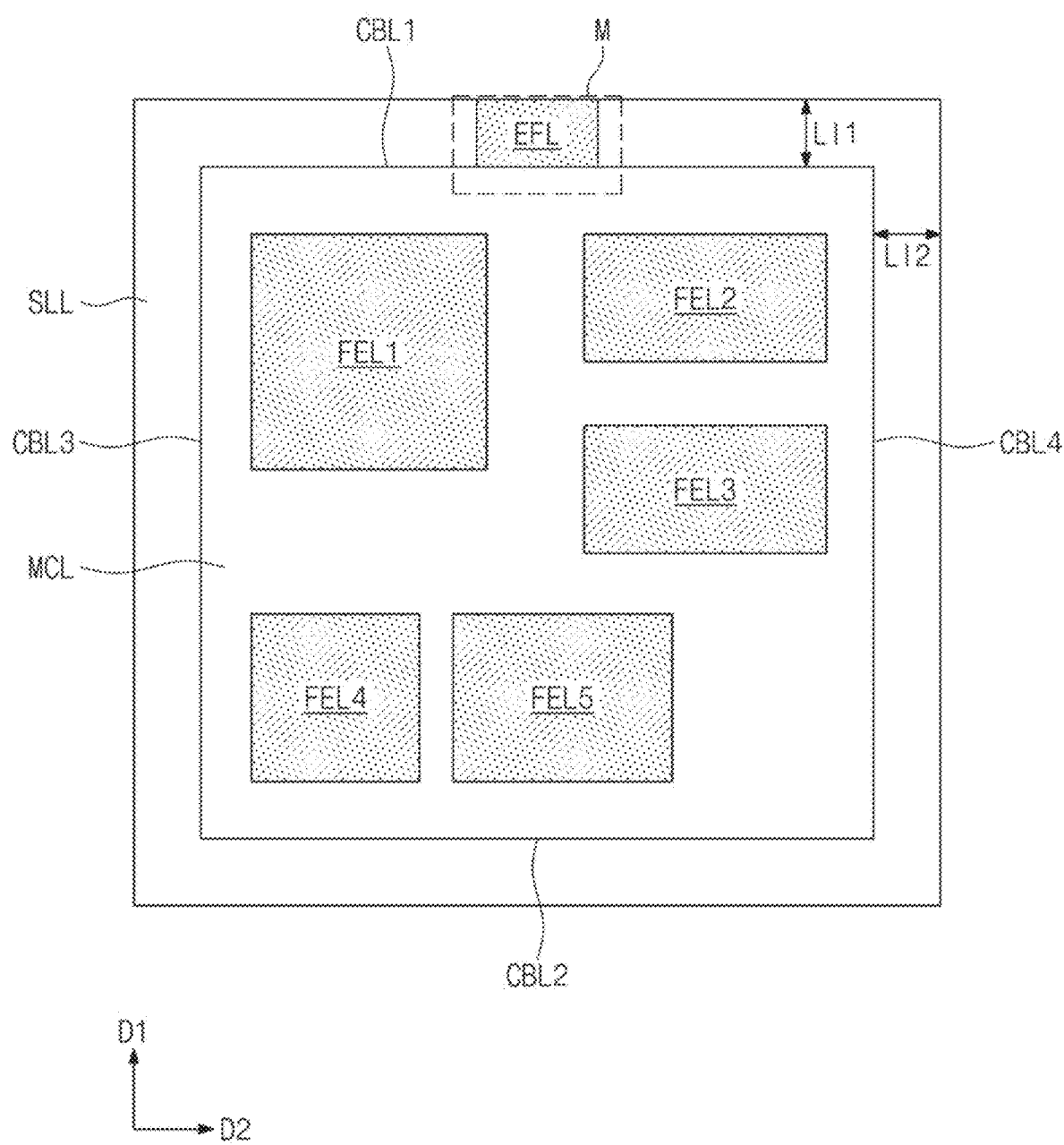

FIGS. 2 and 3 are schematic diagrams, each of which illustrates a semiconductor chip layout according to an embodiment of inventive concepts. Referring to FIGS. 1 and 2, a semiconductor chip layout including a main chip layout MCL may be prepared (in S100). For example, the main chip layout MCL may be a graphic data system (GDS) layout that is a file provided in the form of the GDS file format. In an embodiment, the semiconductor chip layout may include a scribe lane layout SLL, in addition to the main chip layout MCL.

The main chip layout MCL may include a plurality of functional element layouts FEL1-FEL5. For example, the main chip layout MCL may include first to fifth functional element layouts FEL1-FEL5. The first to fifth functional element layouts FEL1-FEL5 may constitute an integrated circuit of a semiconductor chip.

Each of the first to fifth functional element layouts FEL1-FEL5 may be a functional block constituting the integrated circuit. Each of the first to fifth functional element layouts FEL1-FEL5 may include one of a memory block, an analog logic block, an input/output (I/O) logic block, a central processing unit (CPU) block, and a radio frequency block.

The main chip layout MCL may be rectangular. The main chip layout MCL may include first to fourth boundaries CBL1-CBL4, which correspond to respective four sides of the rectangular main chip layout MCL. The first and second boundaries CBL1 and CBL2 may be parallel to a second direction D2 and may be opposite to each other in a first direction D1. The third and fourth boundaries CBL3 and CBL4 may be parallel to the first direction D1 and may be opposite to each other in the second direction D2.

The scribe lane layout SLL may be provided to enclose the main chip layout MCL. The first to fourth boundaries CBL1-CBL4 may be defined between the scribe lane layout SLL and the main chip layout MCL. The scribe lane layout SLL may be adjacent to the first to fourth boundaries CBL1-CBL4 of the main chip layout MCL. The scribe lane layout SLL may include a test element group (TEG) pattern and a key pattern.

A width of the scribe lane layout SLL in the first direction D1 may be a first length LI1. A width of the scribe lane layout SLL in the second direction D2 may be a second length LI2. The first length LI1 and the second length LI2 may be equal to or different from each other.

In an embodiment, the preparing of the semiconductor chip layout may include a layout design process. In detail, the layout design process may be performed to realize a logically-complete integrated circuit on a silicon wafer. For example, the layout design process may be performed, based on the schematic circuit prepared in the high-level design process or the corresponding netlist. The layout design process may include a routing operation of placing and connecting various standard cells that are provided from a cell library, based on a desired and/or alternatively predetermined design rule.

After the routing operation, a verification operation may be performed on the layout to check whether there is a portion violating the given design rule. In an embodiment, the verification operation may include evaluating verification items, such as a design rule check (DRC), an electronical rule check (ERC), and a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

In another embodiment, the semiconductor chip layout may be provided from a designer. The method according to an embodiment of inventive concepts may include operations which are performed to actually realize a semiconductor chip on a wafer, based on the semiconductor chip layout provided from the designer.

Referring to FIGS. 1 and 3, a fuse layout EFL may be disposed in the scribe lane layout SLL (in S110). For example, the fuse layout EFL may be disposed adjacent to the first boundary CBL1 of the main chip layout MCL. The fuse layout EFL may be disposed in a portion of the scribe lane layout SLL adjacent to the first boundary CBL1.

According to an embodiment of inventive concepts, although the fuse layout EFL is disposed in the scribe lane layout SLL, a width of the scribe lane layout SLL may not be changed. In other words, the first length LIL in the first direction D1, of the scribe lane layout SLL of FIG. 3 may be equal to the first length LIL in the first direction D1, of the scribe lane layout SLL of FIG. 2.

The fuse layout EFL may include a programmable device, in which a code can be input. For example, the fuse layout EFL may include an electrical fuse (e-fuse). Although the fuse layout EFL is disposed in the scribe lane layout SLL, the fuse layout EFL may be connected to the main chip layout MCL.

In a comparative example, the fuse layout EFL may be disposed in the main chip layout MCL. A fuse structure, which is formed based on the fuse layout EFL, may be used when a semiconductor chip formed on a wafer is tested. In the case where the fuse layout EFL is disposed in the main chip layout MCL, the fuse structure may be left in a final structure of the semiconductor chip. In this case, a security problem may occur, because the fuse structure contains the designer's code as it is.

By contrast, according to an embodiment of inventive concepts, the fuse layout EFL may be disposed in the scribe lane layout SLL. A fuse structure, which is formed based on the fuse layout EFL, may be removed when a wafer dicing process is performed on the scribe lane. Accordingly, the fuse structure, in which the designer's code is stored, may not exist in the final structure of the semiconductor chip. Thus, it may be possible to limit and/or prevent the security issue from occurring in a semiconductor chip or to improve a security property of the semiconductor chip.

Figure 4:
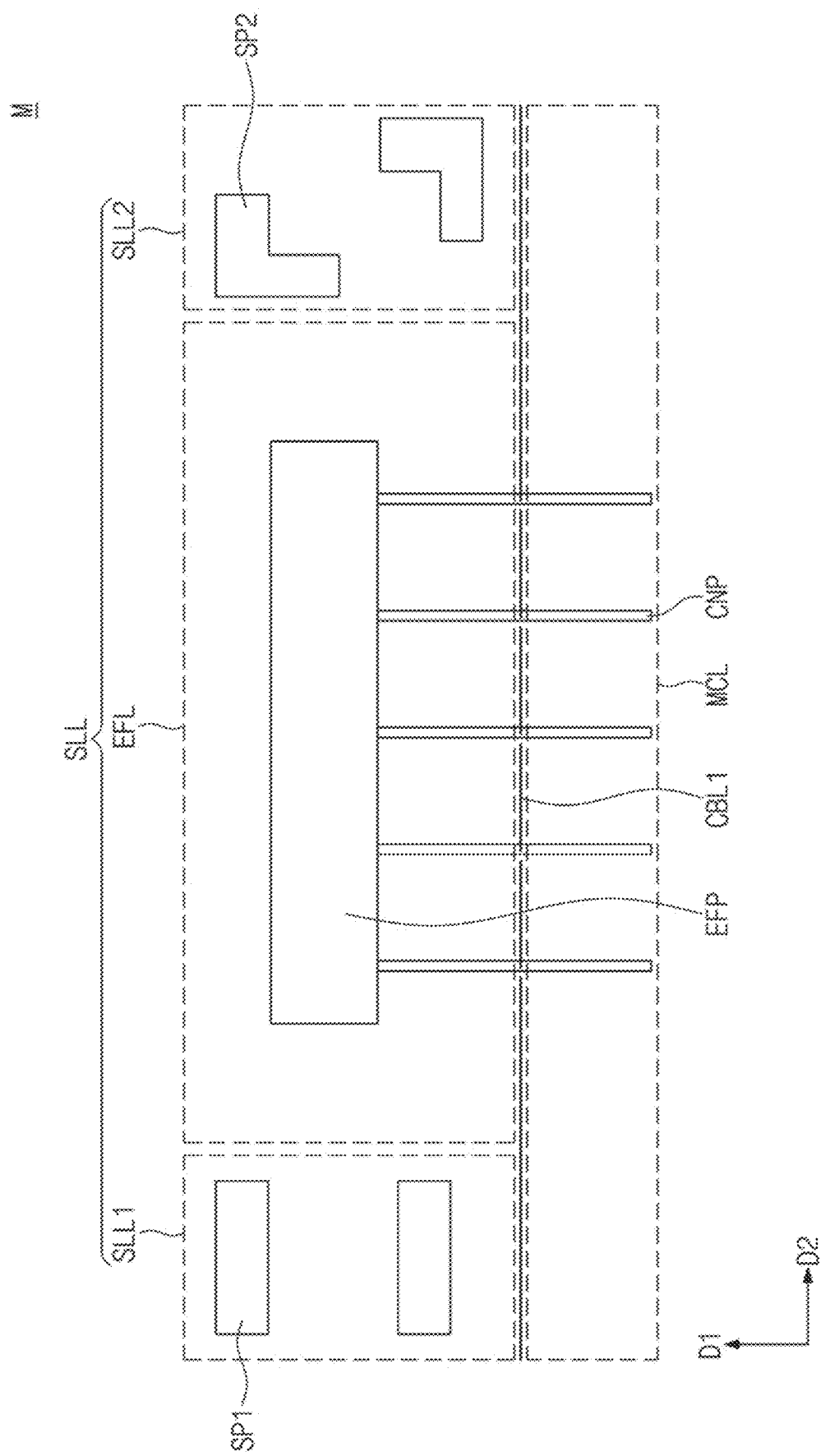
FIG. 4 is an enlarged plan view illustrating a portion 'M' of FIG. 3.

FIG. 4 is an enlarged plan view illustrating a portion 'M' of FIG. 3. FIG. 4 illustrates a layout of a specific layer in the semiconductor chip layout. For example, FIG. 4 illustrates a layout of an FEOL layer of the semiconductor chip.

The scribe lane layout SLL may include a first scribe lane layout SLL1 and a second scribe lane layout SLL2, which are respectively placed at opposite ends of the fuse layout EFL and the fuse layout EFL. The first scribe lane layout SLL1 may include a first supplementary pattern SP1, and the second scribe lane layout SLL2 may include a second supplementary pattern SP2. Each of the first and second supplementary patterns SP1 and SP2 may be a TEG pattern or a key pattern.

The fuse layout EFL may include a fuse pattern EFP and connection patterns CNP, which are extended from the fuse pattern EFP toward the main chip layout MCL. The connection patterns CNP may extend parallel to the first direction D1 and may have a line shape. The connection patterns CNP may be extended from the fuse layout EFL into the main chip layout MCL beyond the first boundary CBL1 of the main chip layout MCL.

FIGS. 5 to 11 are schematic diagrams illustrating a method of performing a data preparation process on the layout of FIG. 4.

Figure 5:
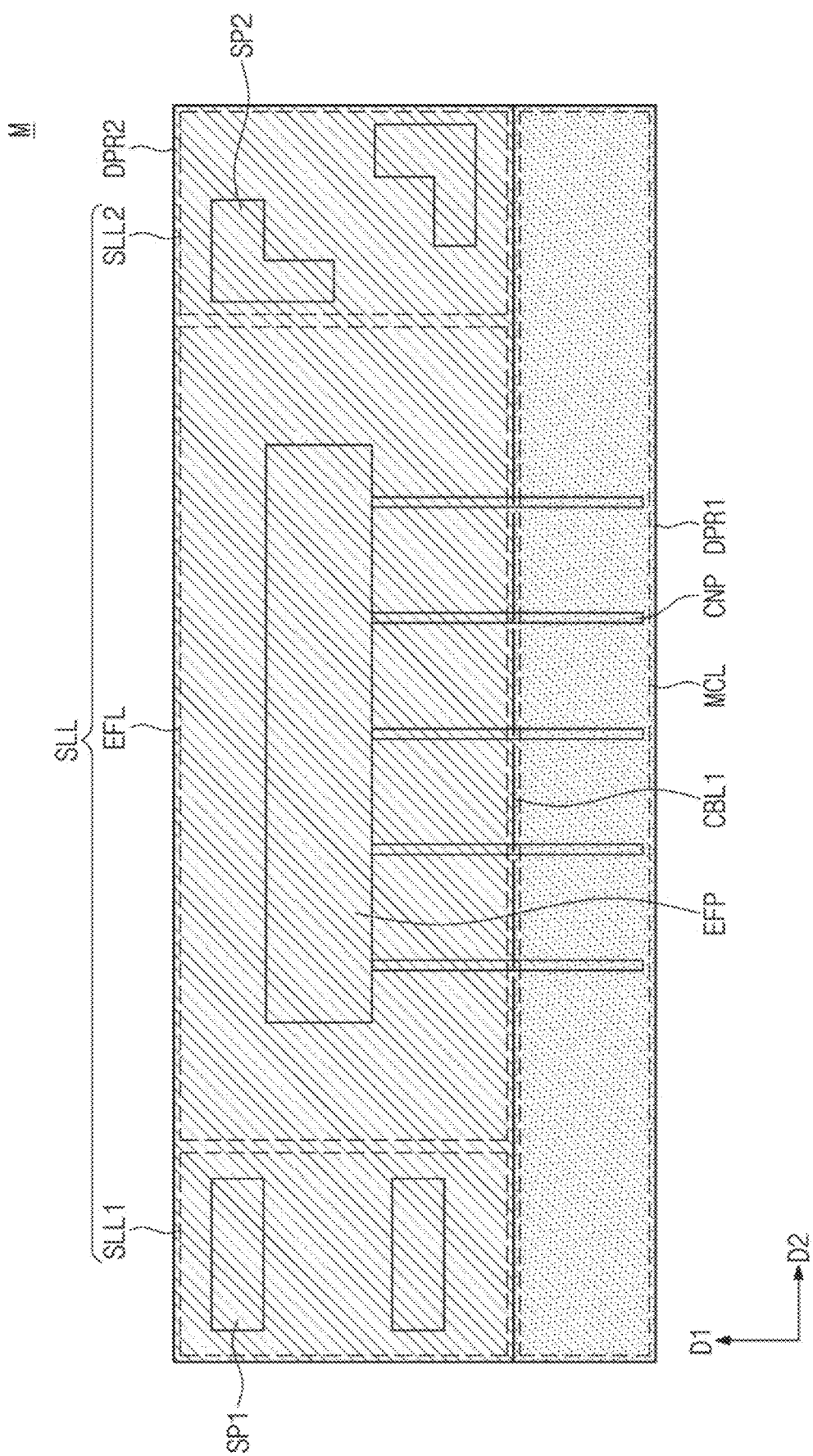

Referring to FIGS. 1 and 5, the main chip layout MCL may be set as a first data preparation region DPR1 (in S120). In the data preparation process according to an embodiment of inventive concepts, a target layout should have a rectangular shape. If the target layout has a polygonal shape, an OPC rule may be applied incorrectly, and in this case, there may be a difficulty in performing the data preparation process.

In the case where the main chip layout MCL and the fuse layout EFL are set as the first data preparation region DPR1, a target region may have a polygonal shape, not a rectangular shape. In the case where the target region is polygonal, the data preparation process cannot be performed, and thus, it may be difficult to set the main chip layout MCL and the fuse layout EFL collectively as the first data preparation region DPR1.

The scribe lane layout SLL, in which the fuse layout EFL is disposed, may be set as a second data preparation region DPR2 (in S130). Since the scribe lane layout SLL including the fuse layout EFL has a rectangular shape, it may be set as the second data preparation region DPR2. Since the fuse layout EFL is a functional element connected to the main chip layout MCL, it may be preferable to perform the data preparation process on both of the fuse layout EFL and the main chip layout MCL. However, due to the limitation on the shape of the target region in the afore-described data preparation process, the fuse layout EFL, which is combined with not the main chip layout MCL but the scribe lane layout SLL, may be set as the second data preparation region DPR2.

Referring to FIGS. 1 and 6, the data preparation process may be performed on the first data preparation region DPR1 (in S140). For example, the data preparation process may be performed on the main chip layout MCL. The data preparation process on the first data preparation region DPR1 may include performing an optical proximity correction (OPC) process and performing a mask data preparation (MDP) process.

First, the optical proximity correction (OPC) process may be performed on the first data preparation region DPR1. Layout patterns, which are prepared by the layout design process, may be realized on a silicon wafer through a photolithography process. The OPC process may be performed to correct an optical proximity or distortion effect, which may occur in the photolithography process. That is, by performing the OPC process, it may be possible to correct optical distortion effects (e.g., refraction) or process effects, which may be caused by an optical effect during an exposure operation performed using a designed pattern. As a result of the OPC process, the shapes and positions of patterns in the designed layout may be changed or biased.

As illustrated in FIG. 6, the connection patterns CNP in the first data preparation region DPR1 may be corrected through the optical proximity correction (OPC) process. For example, the shapes and/or positions of the connection pattern CNP in the main chip layout MCL may be changed. After the OPC process, a layout verification process may be performed to examine whether there is a portion violating an OPC rule and/or a mask rule.

Referring to FIG. 7, the mask data preparation (MDP) process may be performed on the first data preparation region DPR1. The MDP process may include generating first dummy patterns DMP1. The first dummy patterns DMP1 may be generated in the first data preparation region DPR1. The first dummy patterns DMP1 may be generated in an empty region, in which the connection patterns CNP are absent. Since the first dummy patterns DMP1 fill the empty region, it may be possible to improve uniformity of a pattern density. For example, since the uniformity of the pattern density is improved, it may be possible to limit and/or prevent a process defect caused by an optical distortion effect.

The first dummy patterns DMP1 may not be generated in a region adjacent to a boundary of the first data preparation region DPR1. For example, the first dummy patterns DMP1 may not be generated in a region of the main chip layout MCL, which is disposed adjacent to the first boundary CBL1. A first separation distance SED1 may be defined between the first boundary CBL1 and the first dummy pattern DMP1, which is most adjacent to the first boundary CBL1. The first separation distance SED1 may be larger than a pitch between the first dummy patterns DMP1.

After the MDP process, a layout verification process may be performed to examine whether there is a portion violating a mask rule. For example, a mask rule check MRC may be performed, after the MDP process. After the data preparation process, the first data preparation region DPR1 of FIG. 7 may be output as a first resulting structure (in S140).

Referring to FIGS. 1 and 8, a data preparation process may be performed on the second data preparation region DPR2 (in S150). The data preparation process on the second data preparation region DPR2 may be performed in a manner that is different and distinct from the data preparation process on the first data preparation region DPR1 described above.

First, an optical proximity correction (OPC) process may be performed on the first and second scribe lane layouts SLL1 and SLL2 of the second data preparation region DPR2. An OPC rule for the first and second scribe lane layouts SLL1 and SLL2 may be different from an OPC rule for the fuse layout EFL. Thus, the optical proximity correction (OPC) process may be performed on only the first and second scribe lane layouts SLL1 and SLL2, not on the fuse layout EFL.

As illustrated in FIG. 8, the first and second supplementary patterns SP1 and SP2 in the second data preparation region DPR2 may be corrected through the optical proximity correction (OPC) process. For example, the shapes and/or positions of the first and second supplementary patterns SP1 and SP2 in the first and second scribe lane layouts SLL1 and SLL2 may be changed. Next, an OPC rule check (ORC) process may be performed.

Figure 9:
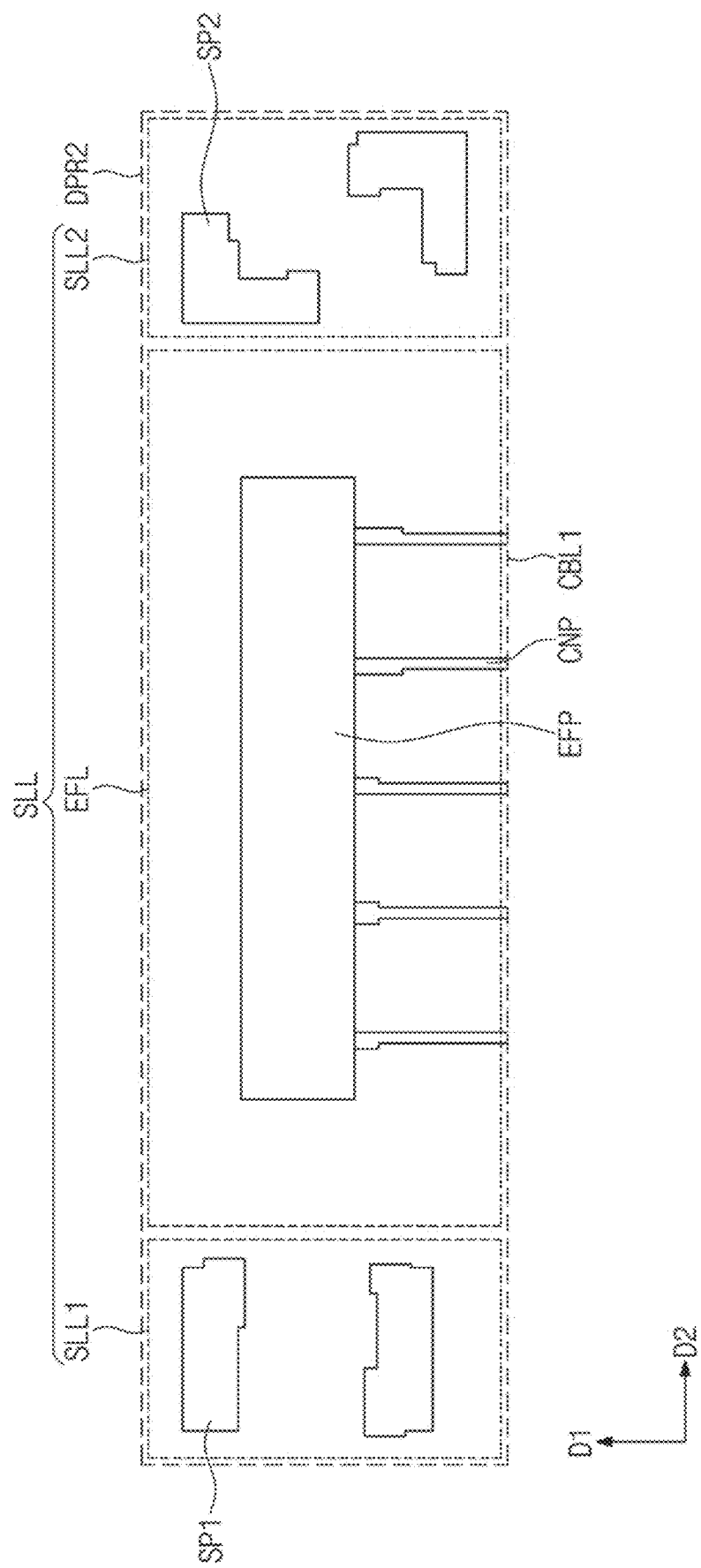

Referring to FIG. 9, an optical proximity correction process may be performed on the fuse layout EFL of the second data preparation region DPR2. An OPC rule for the fuse layout EFL may be the same as an OPC rule for the main chip layout MCL. As illustrated in FIG. 9, the fuse pattern EFP and the connection patterns CNP in the second data preparation region DPR2 may be corrected through the OPC process. For example, the shapes and/or positions of the connection patterns CNP in the fuse layout EFL may be changed. Thereafter, the OPC rule check (ORC) process may be performed.

Figure 10:
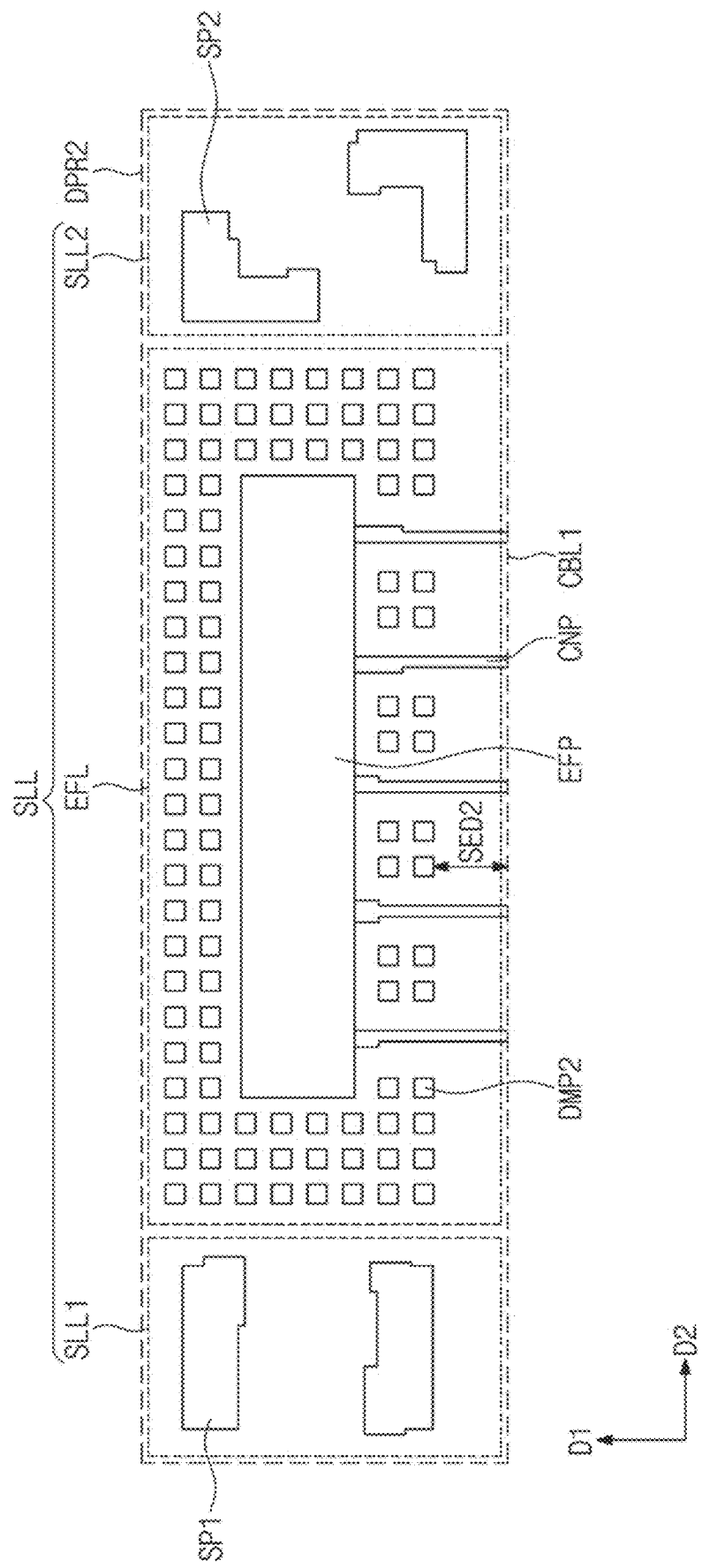

Referring to FIG. 10, a mask data preparation process may be performed on the fuse layout EFL of the second data preparation region DPR2. The MDP process may include generating second dummy patterns DMP2. The second dummy patterns DMP2 may be generated in the fuse layout EFL of the second data preparation region DPR2. Although not shown, dummy patterns may be generated in the first and second scribe lane layouts SLL1 and SLL2.

The second dummy patterns DMP2 may be generated in an empty region, in which the fuse pattern EFP and the connection patterns CNP are absent. Since the second dummy patterns DMP2 fill the empty region, it may be possible to improve uniformity of a pattern density.

The second dummy patterns DMP2 may not be generated adjacent to a boundary of the second data preparation region DPR2. For example, the second dummy patterns DMP2 may not be generated in a region that is adjacent to the first boundary CBL1 of the main chip layout MCL. A second separation distance SED2 may be defined between the first boundary CBL1 and the second dummy pattern DMP2 most adjacent thereto. The second separation distance SED2 may be larger than a pitch between the second dummy patterns DMP2. The second separation distance SED2 may be equal to or different from the first separation distance SED1 of FIG. 7.

After the MDP process, a layout verification process may be performed to examine whether there is a portion violating a mask rule. For example, a mask rule check may be performed, after the MDP process. After the data preparation process, the second data preparation region DPR2 of FIG. 10 may be output as a second resulting structure (in S150).

Figure 11:
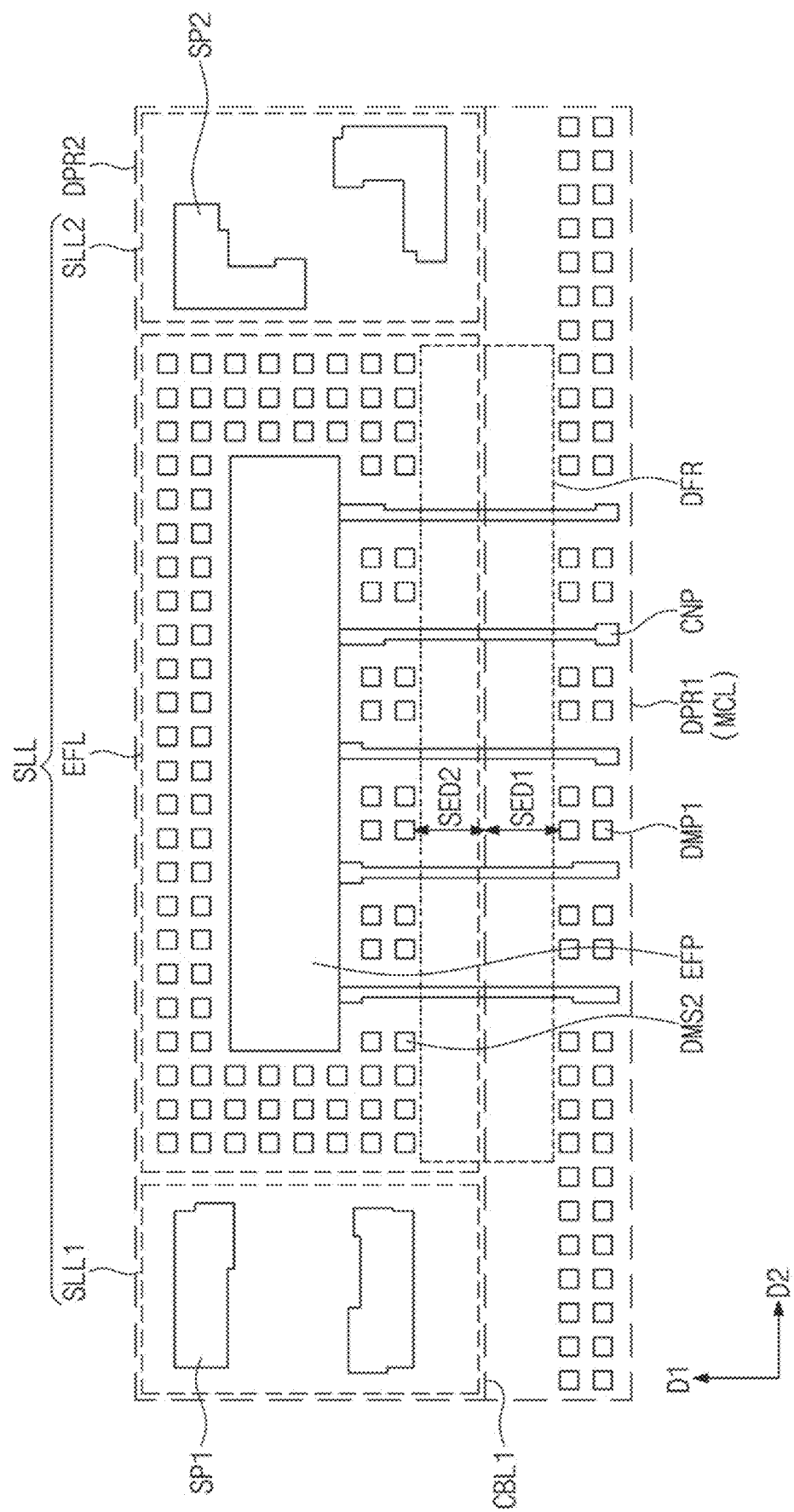

Referring to FIGS. 1 and 11, the first resulting structure of FIG. 7 and the second resulting structure of FIG. 10 may be merged to generate a mask data for generating a mask (in S160). The merging of the first and second resulting structures may include matching the first boundary CBL1 of the first resulting structure with the first boundary CBL1 of the second resulting structure and aligning the connection patterns CNP of the first resulting structure to the connection patterns CNP of the second resulting structure. Since the connection patterns CNP of the first resulting structure are aligned to the connection patterns CNP of the second resulting structure, the connection patterns CNP may be generated to continuously extend from the fuse pattern EFP into the main chip layout MCL.

As shown in the mask data of FIG. 11, a dummy-free region DFR may be generated on the first boundary CBL1. The dummy-free region DFR may be defined between the first dummy pattern DMP1 and the second dummy pattern DMP2. The dummy-free region DFR may be overlapped with the first boundary CBL1. Since there is no dummy pattern in the dummy-free region DFR, the dummy-free region DFR may be an empty region. A length in the first direction D1 of the dummy-free region DFR may be equal to a sum of the first and second separation distances SED1 and SED2.

The dummy-free region DFR may be generated by performing an additional data preparation process on each of the main chip layout MCL and the fuse layout EFL. As a comparative example, in the case where the same data preparation process is performed on the first data preparation region DPR1 which is set by collectedly combining the main chip layout MCL and the fuse layout EFL, dummy patterns are inevitably generated in the dummy-free region DFR of FIG. 11.

Since the first and second resulting structures are merged, it may be possible to obtain a mask data, in which the data preparation process on the semiconductor chip layout of FIG. 3 has been finished. A photomask may be manufactured, based on the mask data (in S170).

Figure 12:
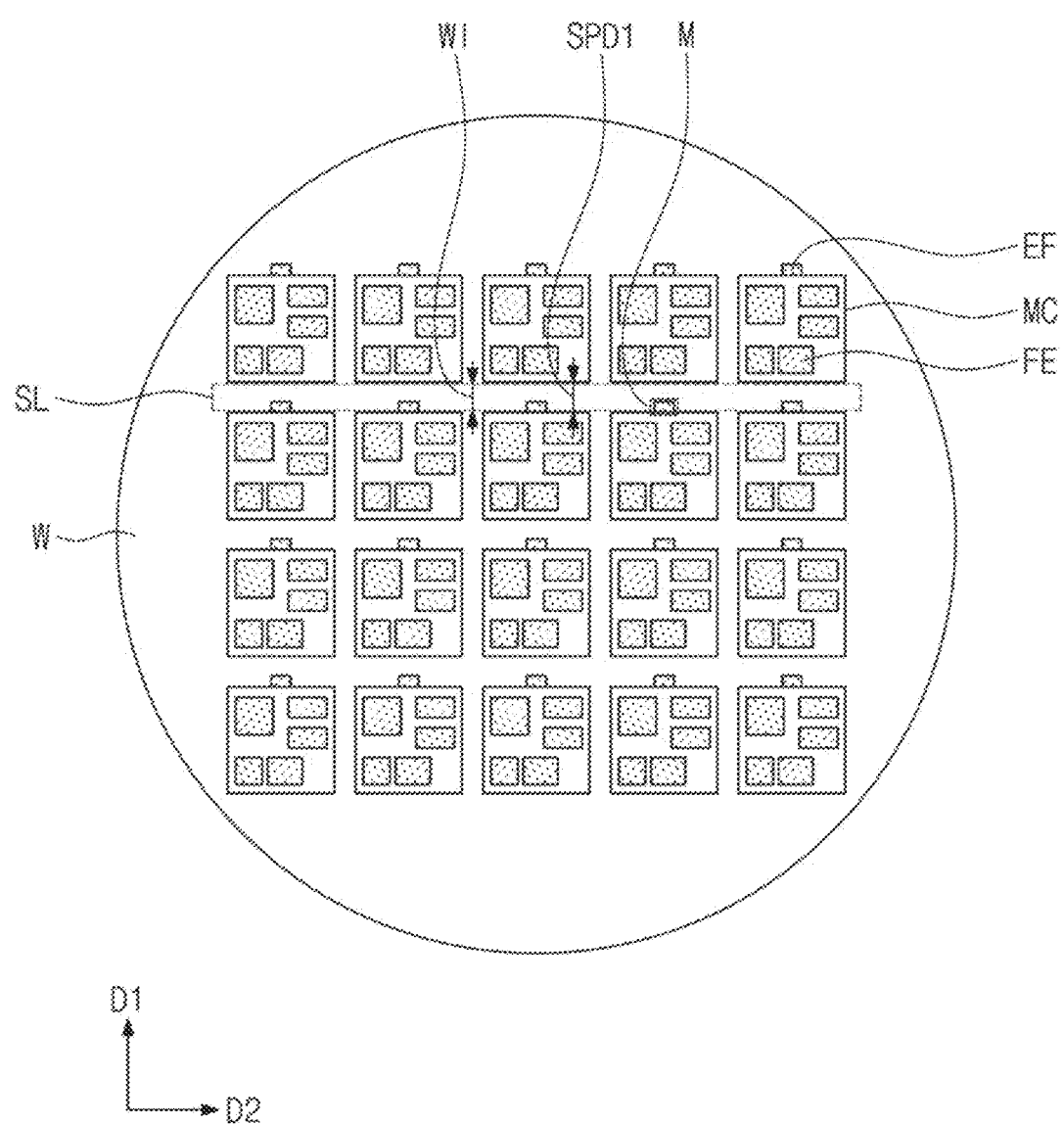
FIG. 12 is a plan view illustrating semiconductor chips, which are formed on a wafer, according to an embodiment of inventive concepts.
Figure 13:
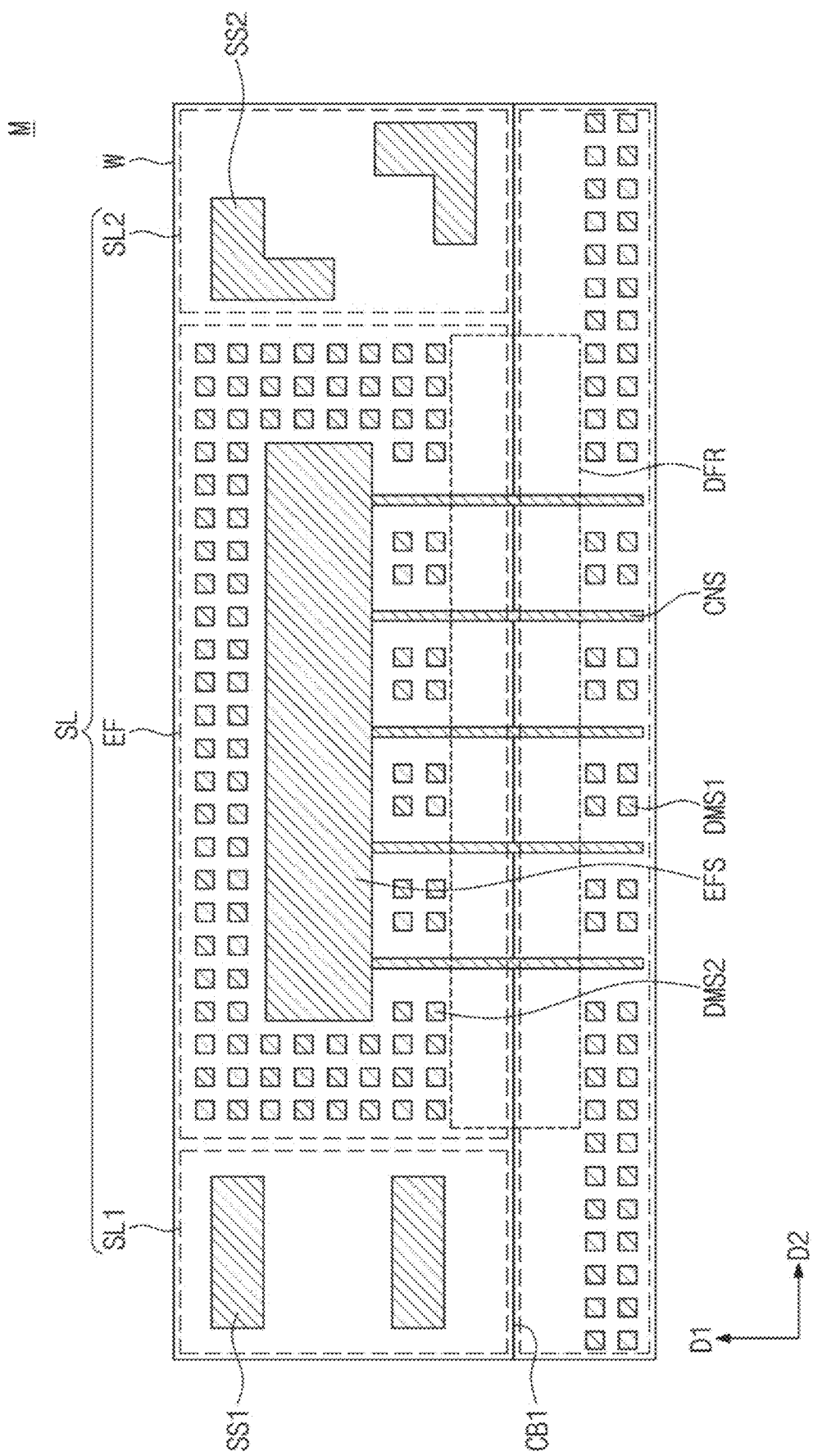
FIG. 13 is an enlarged plan view illustrating a portion 'M' of FIG. 12.

FIG. 12 is a plan view illustrating semiconductor chips, which are formed on a wafer, according to an embodiment of inventive concepts. FIG. 13 is an enlarged plan view illustrating a portion 'M' of FIG. 12.

Referring to FIGS. 1 and 12, semiconductor chips may be formed on a wafer W using a manufactured photomask (in S180). In the actual fabricating process using the photomask, various exposing and etching operations may be repeatedly performed. As a result of these operations, various patterns, which have shapes defined by the layout design process, may be sequentially formed on the wafer W. Each of the semiconductor chips on the wafer W may include a main chip MC and a scribe lane SL, which is provided around the main chips MC.

The main chips MC may be two-dimensionally arranged on the wafer W. The scribe lane SL may be provided between the main chips MC. Each of the main chips MC may include at least one fuse cell EF, which is adjacent to a boundary thereof. The fuse cell EF may be disposed in the scribe lane SL. Each of the main chips MC may include a plurality of functional elements FE. The functional elements FE may be devices, which are formed by realizing the first to fifth functional element layouts FEL1-FEL5 previously described with reference to FIG. 2 on the wafer W.

In an embodiment, the main chips MC, which are adjacent to each other in the first direction D1, may be spaced apart from each other in a first distance SPD1. The scribe lane SL between the main chips MC, which are adjacent to each other in the first direction D1, may have a width WI in the first direction D1. The width WI of the scribe lane SL may be substantially equal to the first distance SPD1.

Referring to FIG. 13, the scribe lane SL may be adjacent to a first boundary CB1 of the main chip MC. The scribe lane SL may include the fuse cell EF adjacent to the first boundary CB1, a first scribe lane SL1 at a side of the fuse cell EF, and a second scribe lane SL2 at an opposite side of the fuse cell EF.

The main chip MC may include first dummy structures DMS1, which are adjacent to the first boundary CB1. The fuse cell EF may include a fuse structure EFS and second dummy structures DMS2, which are provided around the fuse structure EFS. Connection structures CNS may be provided to extend from the fuse structure EFS into the main chip MC. At least one of the first dummy structures DMS1 may be disposed between adjacent ones of the connection structures CNS. At least one of the second dummy structures DMS2 may be disposed between adjacent ones of the connection structures CNS.

The first scribe lane SL1 may include a first supplementary structure SS1, and the second scribe lane SL2 may include a second supplementary structure SS2. Each of the first and second supplementary structures SS1 and SS2 may be a TEG pattern or a key pattern.

The dummy-free region DFR may be defined on the first boundary CB1 between the main chip MC and the fuse cell EF. As previously described with reference to FIG. 11, the first and second dummy structures DMS1 and DMS2 may not exist in the dummy-free region DFR. The second dummy structure DMS2, which is closest to the first boundary CB1, may be spaced apart from the first dummy structure DMS1, which is closest to the first boundary CB1, in the first direction D1 with the dummy-free region DFR interposed therebetween.

A pattern density of the dummy-free region DFR may be smaller than a pattern density of the main chip MC and a pattern density of the fuse cell EF. Here, the pattern density may mean the number of dummy patterns disposed within a given area. For example, a width of the dummy-free region DFR in the first direction D1 may be larger than five times a pitch between the first dummy structures DMS1.

The structures shown in FIG. 13 may be conductive patterns in the FEOL layer. The structures of FIG. 13 (e.g., the conductive patterns of the FEOL layer) may be formed of or include at least one of doped semiconductor materials (e.g., doped polysilicon), metallic materials, or metal nitride materials.

Referring back to FIGS. 12 and 13, the fuse cell EF may be connected to the functional elements FE, respectively, in the main chip MC through the connection structures CNS. The functional elements FE in the main chip MC may be tested through a code, which is programmed in the fuse cell EF. As a result of the test, it may be possible to examine whether or not there is a failure in each of the main chips MC.

Figure 14A:
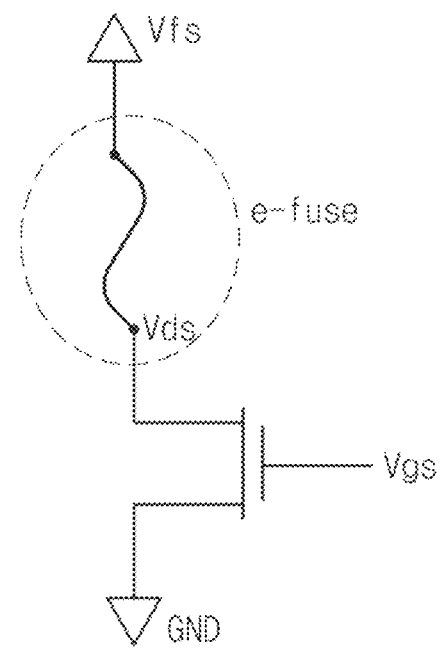
FIGS. 14A and 14B illustrate a fuse cell according to an embodiment of inventive concepts.
Figure 14B:
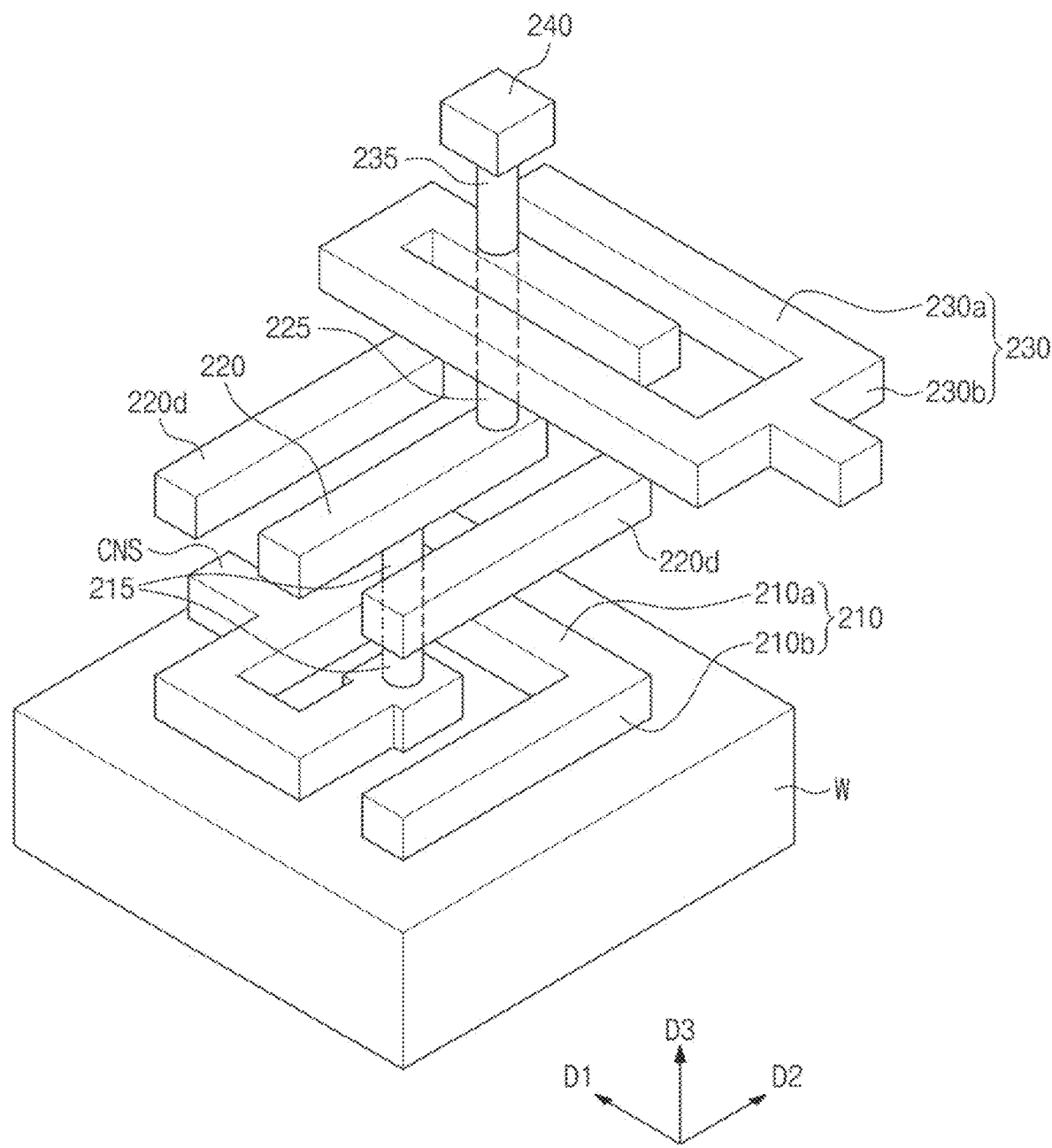

FIGS. 14A and 14B illustrate a fuse cell according to an embodiment of inventive concepts, FIG. 14A illustrates a circuit diagram of an electrical fuse (e-fuse), and FIG. 14B illustrates a structure of the e-fuse.

Referring to FIG. 14A, a fuse driving circuit may include an e-fuse. The e-fuse may include one end, which is electrically connected to a transistor, and an opposite end, to which a specific voltage is applied.

The transistor of FIG. 14A may be a transistor that is provided in the functional element FE in the main chip MC of FIG. 12. A gate voltage Vgs may be applied to the gate of the transistor, and a ground voltage GND may be provided to one end of the transistor. In the case where the gate voltage Vgs is applied to the gate of the transistor and a voltage Vfs is applied to the opposite end of the e-fuse, the e-fuse may be blown, and in this case, a resistance value of the e-fuse may be increased. In other words, the e-fuse may be physically opened. That is, a resistance value of the e-fuse may be measured by applying the specific voltage to the opposite ends of the e-fuse, and in this case, the measured resistance value may be used to determine whether the fuse is blown. The e-fuse may be programmed by applying the specific voltage to the opposite ends of the e-fuse.

FIG. 14B illustrates an example of an e-fuse structure in the fuse cell EF of FIGS. 12 and 13. The fuse structure EFS may have a three-dimensional structure. The fuse structure EFS may include a cathode pattern 210, a fuse link 220, and an anode pattern 230. The cathode pattern 210 may be disposed on the wafer W. The fuse link 220 may be placed at a first height from a top surface of the wafer W, and the anode pattern 230 may be placed at a second height, which is higher than the first height, from the top surface of the wafer W. Dummy fuse links 220d may be disposed at the same height as the fuse link 220.

The cathode pattern 210 may be disposed in the FEOL layer shown in FIG. 13. In other words, a plurality of cathode patterns 210 may be collectively provided to constitute the fuse structure EFS of FIG. 13. The cathode pattern 210 may include first portions 210a extending in the first direction D1 and second portions 210b extending in the second direction D2. A first contact plug 215 connecting the fuse link 220 to the cathode pattern 210 may be coupled to an end of the cathode pattern 210. An opposite end of the cathode pattern 210 may be connected to the connection structure CNS of FIG. 13.

The fuse link 220 may be disposed in a M1 layer of a BEOL layer. The anode pattern 230 may be disposed in a M2 layer of the BEOL layer. The anode pattern 230 may include first portions 230a extending in the first direction D1 and second portions 230b extending in the second direction D2. A second contact plug 225 connecting the fuse link 220 to the anode pattern 230 may be coupled to an end of the anode pattern 230. The first contact plug 215 and the second contact plug 225 may be offset from each other.

As an example, the cathode pattern 210 may be formed of or include doped polysilicon. As an example, the fuse link 220 and the anode pattern 230 may be formed of or include a metallic material selected from the group consisting of tungsten (W), aluminum (Al), copper (Cu), and copper alloys. Here, the copper alloys may include copper-based materials, in which at least one of C, Ag, Co, Ta, In, Sn, Zn, Mn, Ti, Mg, Cr, Ge, Sr, Pt, Mg, Al, or Zr is contained in a small amount.

The fuse structure EFS may further include a dummy metal plug 235 and a dummy metal pattern 240. The dummy metal plug 235 may be in contact with a portion of the anode pattern 230. The dummy metal plug 235 may be coupled to the first portion 230a of the anode pattern 230. The dummy metal pattern 240 may be coupled to the dummy metal plug 235.

Figure 15:
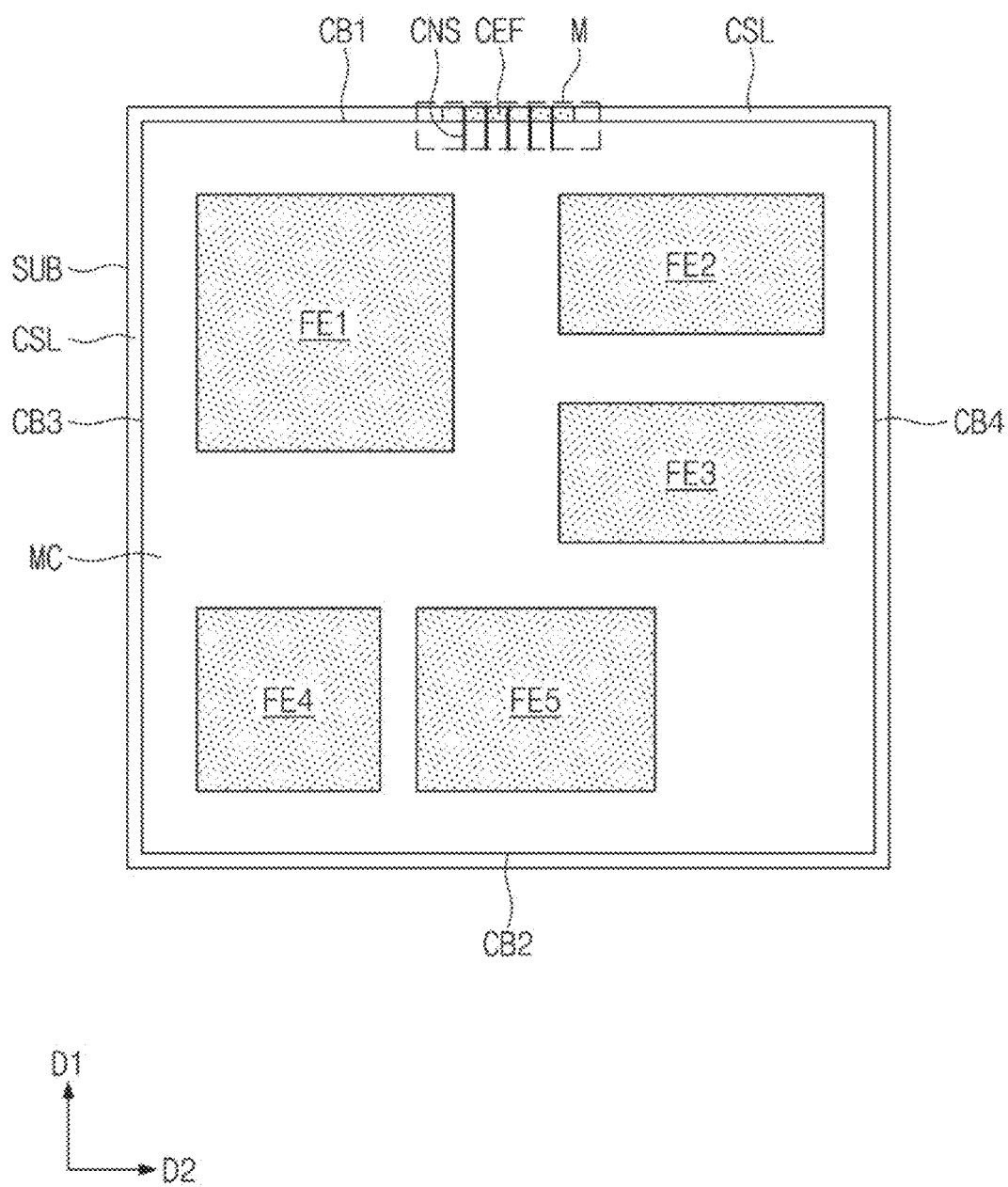
FIG. 15 is a plan view illustrating a semiconductor chip, which is cut by dicing the wafer of FIG. 12.
Figure 16:
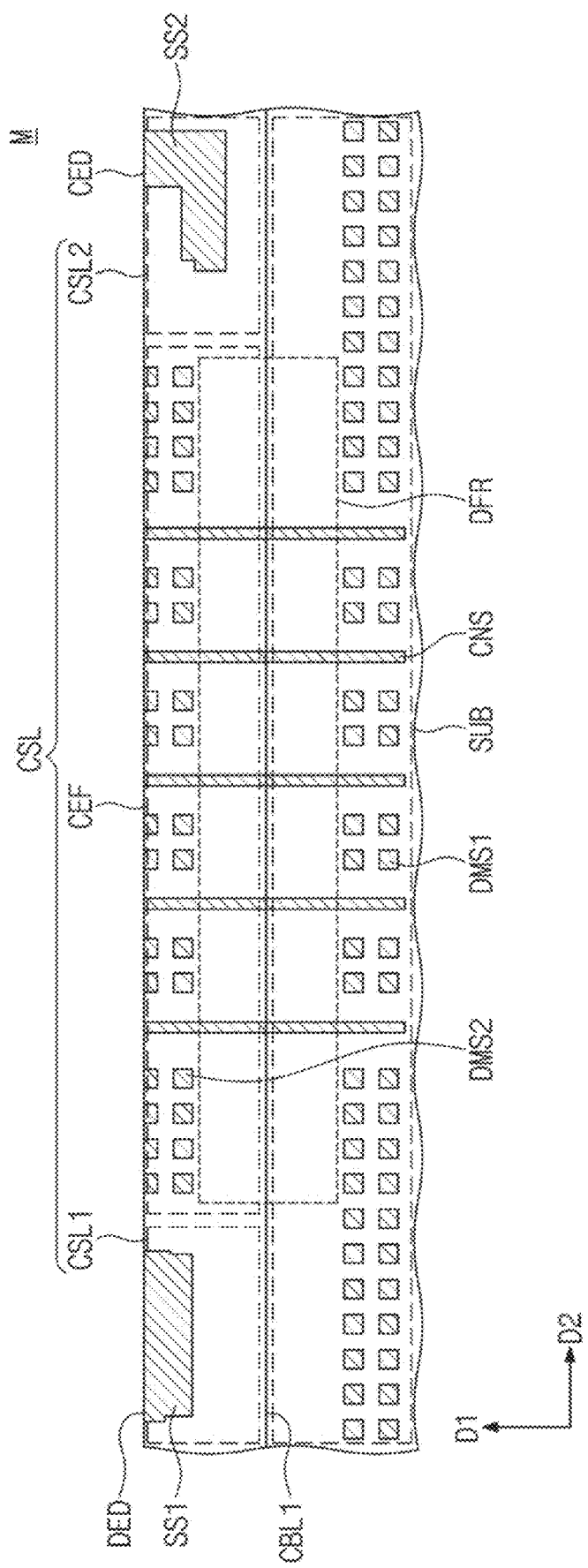
FIG. 16 is an enlarged plan view illustrating a portion 'M' of FIG. 15.

FIG. 15 is a plan view illustrating a semiconductor chip, which is cut by dicing the wafer of FIG. 12. FIG. 16 is an enlarged plan view illustrating a portion 'M' of FIG. 15.

Referring to FIGS. 1 and 15, a dicing process may be performed on the wafer W of FIG. 12 to divide the main chips MC into a plurality of semiconductor chips (in S190). The dicing process may include cutting the wafer W along the scribe lane SL. Most of the scribe lane SL may be removed by the dicing process.

The semiconductor chip of FIG. 15 may include the main chip MC and a cut scribe lane CSL enclosing the main chip MC. The main chip MC may include first to fifth functional elements FE1-FE5 on a substrate SUB. The substrate SUB may be a part of the wafer W, which is cut by the dicing process. The substrate SUB may support the first to fifth functional elements FE1-FE5.

The main chip MC may include first to fourth boundaries CB1-CB4. The first to fourth boundaries CB1-CB4 may be defined between the cut scribe lane CSL and the main chip MC. The cut scribe lane CSL may include a cut fuse cell CEF, which is placed adjacent to the first boundary CB1 of the main chip MC. The connection structures CNS may be provided to extend from the cut fuse cell CEF into the main chip MC. In other words, the connection structures CNS may be left after the dicing process on the wafer W.

Referring to FIG. 16, the cut scribe lane CSL on the first boundary CB1 may include a first cut scribe lane CSL1, a second cut scribe lane CSL2, and the cut fuse cell CEF. The cut fuse cell CEF may be interposed between the first and second cut scribe lanes CSL1 and CSL2.

The main chip MC may be substantially the same as that previously described with reference to FIG. 13. This is because the main chip MC is not affected by the dicing process. The main chip MC may include the first dummy structures DMS1 as they are. The first cut scribe lane CSL1 may include a cut portion of the first supplementary structure SS1 left after the dicing process, and the second cut scribe lane CSL2 may include a cut portion of the second supplementary structure SS2 left after the dicing process.

The fuse structure EFS of the fuse cell EF of FIG. 13 may be removed by the dicing process and may be absent in the cut fuse cell CEF. The cut fuse cell CEF may include some of the second dummy structures DMS2 left after the dicing process. The connection structures CNS may be extended from an edge CED of the semiconductor chip into the main chip MC to cross the cut fuse cell CEF.

At least one of the second dummy structures DMS2 may be disposed between adjacent ones of the connection structures CNS. The at least one second dummy structure DMS2 may be placed on the same line as the cut first supplementary structure SS1 in the second direction D2. The at least one second dummy structure DMS2 may be placed on the same line as the cut second supplementary structure SS2 in the second direction D2.

The dummy-free region DFR may still exist on the first boundary CB1 between the main chip MC and the cut fuse cell CEF. As previously described with reference to FIG. 13, the first and second dummy structures DMS1 and DMS2 may not exist in the dummy-free region DFR. The second dummy structure DMS2, which is closest to the first boundary CB1, may be spaced apart from the first dummy structure DMS1, which is closest to the first boundary CB1, in the first direction D1 with the dummy-free region DFR interposed therebetween.

Figure 17:
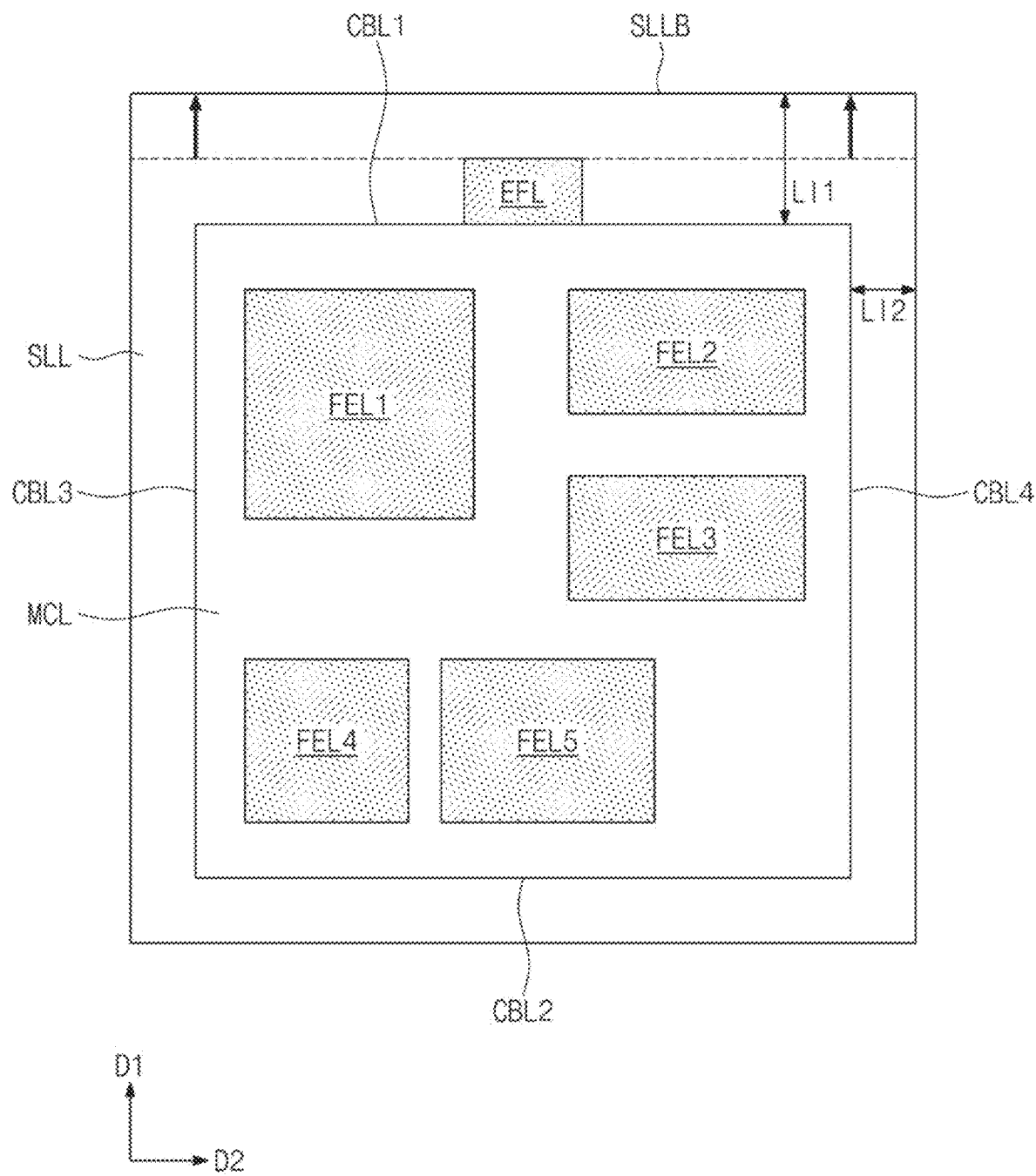
FIG. 17 is a schematic diagram illustrating a semiconductor chip layout according to a comparative example.
Figure 18:
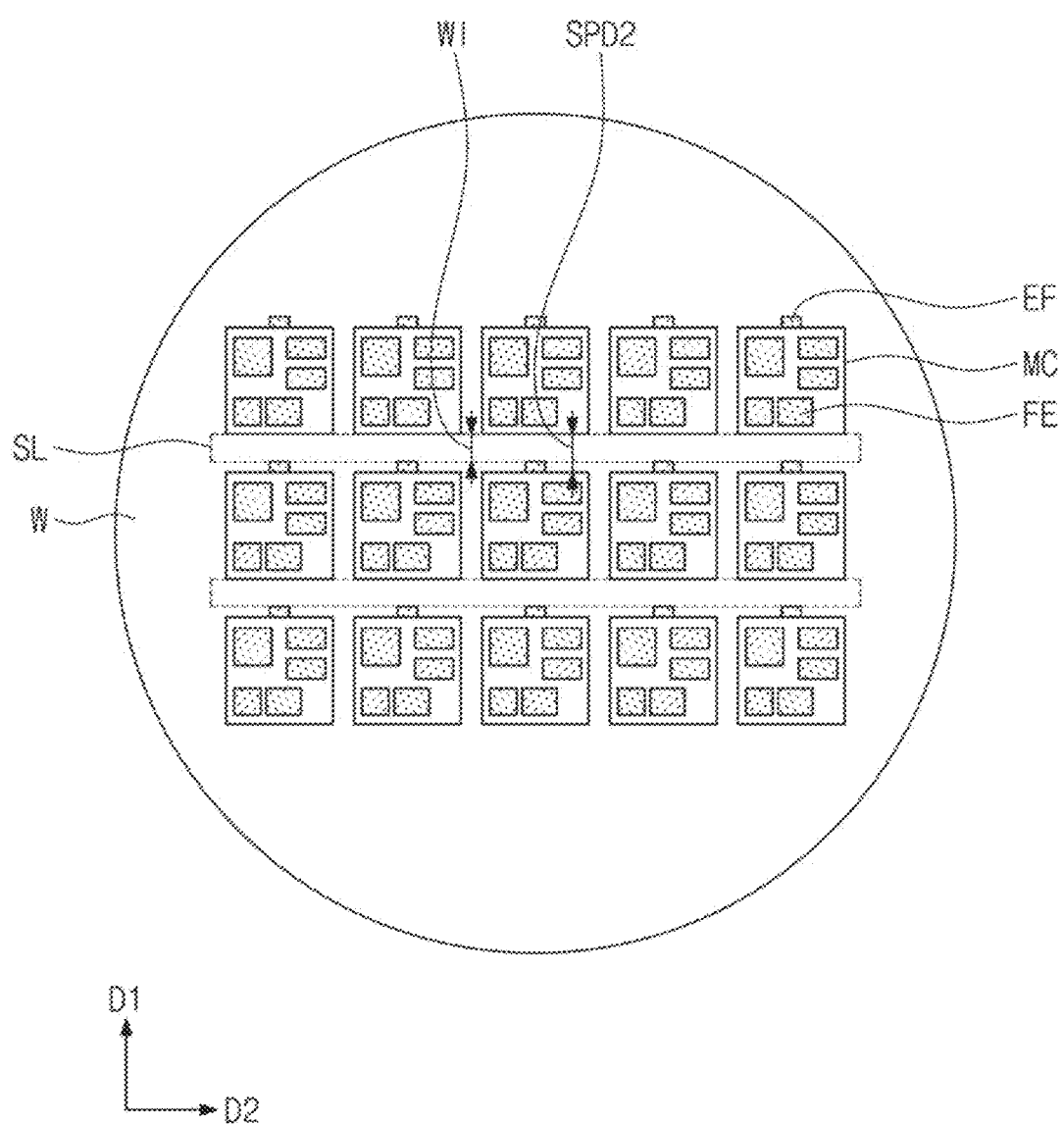
FIG. 18 is a plan view illustrating semiconductor chips, which are formed on a wafer based on the layout of FIG. 17.

FIG. 17 is a schematic diagram illustrating a semiconductor chip layout according to a comparative example. FIG. 18 is a plan view illustrating semiconductor chips, which are formed on a wafer based on the layout of FIG. 17.

Referring to FIG. 17, the fuse layout EFL may be disposed on the first boundary CBL1 of the main chip layout MCL. In this comparative example, after the disposition of the fuse layout EFL, a boundary SLLB of the scribe lane layout SLL may be extended in the first direction D1, unlike the embodiment previously described with reference to FIG. 3. The boundary SLLB of the scribe lane layout SLL may be further extended by a width of the fuse layout EFL in the first direction D1. Thus, the first length LI1 of the scribe lane layout SLL in the first direction D1 may be increased to a value that is larger than the second length LI2 of the scribe lane layout SLL in the second direction D2. The first length LI1, in the first direction D1, of the scribe lane layout SLL in the present embodiment may be larger than the first length LI1, in the first direction D1, of the scribe lane layout SLL of FIG. 3.

In the comparative example, the reason for expanding the scribe lane layout SLL is to collectively set the main chip layout MCL and the fuse layout EFL as the first data preparation region DPR1. Since the scribe lane layout SLL should not be included in the first data preparation region DPR1, by expanding the scribe lane layout SLL in the first direction D1, the supplementary patterns of the scribe lane may not be disposed on the same line as the fuse layout EFL.

Referring to FIG. 18, the main chips MC, which are realized on the wafer W using the layout of FIG. 17, may be spaced apart from each other by a second distance SPD2. The scribe lane SL between the main chips MC, which are adjacent to each other in the first direction D1, may have the same width (e.g., WI) as that in FIG. 12. Meanwhile, since the scribe lane SL in the comparative example is not overlapped with the fuse cell EF, the second distance SPD2 between the main chips MC may be increased to a value that is larger than the first distance SPD1 of FIG. 12.

According to the comparative example, the distance between the main chips MC arranged in the first direction D1 may be increased, and thus, the number of the main chips MC, which can be formed on the wafer W, may be smaller than the number of the main chips MC of FIG. 12.

Meanwhile, according to an embodiment of inventive concepts, since a semiconductor chip is designed and fabricated such that the fuse cell EF is stably formed in the scribe lane SL, it may be possible to increase the number of the main chips MC, which can be formed on the wafer W. Accordingly, it may be possible to improve a net die and a yield of a semiconductor device according to an embodiment of inventive concepts.

In a method of designing and fabricating a semiconductor chip according to an embodiment of inventive concepts, by disposing a fuse cell, in which a code is programmed, in a scribe lane, it may be possible to improve security of the semiconductor chip. Furthermore, since the fuse cell is merged in the scribe lane, the number of semiconductor chips, which can be formed on a wafer, may be increased, and thus, a net die may be increased.

According to an embodiment of inventive concepts, since a data processing operation is performed on a fuse layout as well as a scribe lane layout, an existing data processing operation may be used as it is, and thus, design efficiency may be improved.

One or more of the elements disclosed above may include or be implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

For example, in an example embodiment, a computer system including a controller, an input/output device (e.g., keyboard), and a memory may be provided for designing a semiconductor chip. The controller may be implemented with processing circuitry. The memory may be a volatile memory (e.g., DRAM device) or a non-volatile memory (e.g., Flash device). In response to executing instructions (e.g., software) stored in the memory, processing data (e.g., layout data) stored in the memory and/or data received from a host, and/or operating in response to commands received from a host, the controller of the computing system may be transformed into a special-purpose controller that is configured to perform operations in the method of designing a semiconductor chip according to the example embodiment in FIG. 1 (operations S100 to S160) and FIGS. 2 to 11 of the present application.

While example embodiments of inventive concepts have been particularly shown and described, it will be understood by one of ordinary skill in the art that variations in form and detail may be made therein without departing from the spirit and scope of the attached claims.

What is claimed is:

1. A method of fabricating a semiconductor chip, comprising:
    preparing a semiconductor chip layout, the semiconductor chip layout comprising a main chip layout and a scribe lane layout enclosing the main chip layout;
    disposing a fuse layout in the scribe lane layout, the fuse layout not being in the main chip layout;
    setting the main chip layout as a first data preparation region;
    setting the scribe lane layout and the fuse layout as a second data preparation region;
    obtaining a first resulting structure and a second resulting structure, respectively, by performing a data preparation process on the first data preparation region and the second data preparation region;

merging the first resulting structure and the second resulting structure to generate mask data;
manufacturing a photomask based on the mask data; and
forming semiconductor chips on a wafer using the photomask.

2. The method of claim 1, wherein
the fuse layout is adjacent to a first boundary of the main chip layout,
the main chip layout comprises a first portion of a connection pattern,
the fuse layout comprises a fuse pattern and a second portion of the connection pattern, and
the connection pattern extends from the fuse pattern into the main chip layout, wherein an entirety of the fuse pattern is in the fuse layout.

3. The method of claim 2, wherein
the data preparation process on the first data preparation region comprises generating first dummy patterns in the main chip layout, and
the first dummy patterns are generated around the first portion of the connection pattern and are spaced apart from the first boundary.

4. The method of claim 3, wherein
the data preparation process on the second data preparation region comprises generating second dummy patterns in the fuse layout,
the second dummy patterns are generated around the fuse pattern and the second portion of the connection pattern, and
the second dummy patterns are spaced apart from the first boundary.

5. The method of claim 4, wherein
the mask data comprises a dummy-free region between the first dummy patterns and the second dummy patterns, and
the first boundary overlaps the dummy-free region.

6. The method of claim 2, wherein
the first resulting structure includes the first portion of the connection pattern,
the second resulting structure includes the second portion of the connection pattern, and
the merging the first resulting structure and the second resulting structure comprises aligning the second portion of the connection pattern of the first resulting structure to the first portion of the connection pattern of the second resulting structure.

7. The method of claim 1, wherein the data preparation process on the second data preparation region comprises:
performing a first Optical Proximity Correction process on the scribe lane layout; and
performing a second Optical Proximity Correction process on the fuse layout,
wherein the first Optical Proximity Correction process and the second Optical Proximity Correction process have Optical Proximity Correction rules that are different from each other.

8. The method of claim 7, wherein the second Optical Proximity Correction process has a same Optical Proximity Correction rule as an Optical Proximity Correction process performed on the first data preparation region.

9. The method of claim 1, further comprising:
testing functional elements in a main chip, wherein each of the semiconductor chips comprises the main chip and a fuse cell,
the fuse cell is adjacent to a first boundary of the main chip, and
the testing the functional elements in the main chip is performed through the fuse cell.

10. The method of claim 9, further comprising:
performing a dicing process on the wafer to separate the semiconductor chips from each other,
wherein the fuse cell of each of the semiconductor chips is cut by the dicing process.

11. A method of fabricating a semiconductor chip, comprising:
forming semiconductor chips on a wafer, each of the semiconductor chips comprising a main chip including a first portion of a connection structure, a scribe lane on a first boundary of the main chip, and a fuse cell in the scribe lane,
the fuse cell including a fuse structure and a second portion of the connection structure, the connection structure extending from the fuse structure into the main chip;
testing functional elements in the main chip through the fuse cell, the fuse cell not being in the main chip; and
dicing the wafer to separate the semiconductor chips from each other to provide a plurality of separated semiconductor chips, the dicing the wafer including removing the fuse structure, and
each separated semiconductor chip of the plurality of separated semiconductor chips including a cut portion of the connection structure.

12. The method of claim 11, wherein
the main chip comprises first dummy structures disposed around the first portion of the connection structure,
the fuse cell comprises second dummy structures disposed around the second portion of the connection structure,
the first dummy structures and the second dummy structures are spaced apart from the first boundary such that the main chip and the fuse cell define a dummy-free region between the first dummy structure and the second dummy structure, and
the dummy-free region overlaps the first boundary.

13. The method of claim 12, wherein, after the dicing the wafer, some of the second dummy structures are left in a cut portion of the fuse cell.

14. The method of claim 12, wherein
a separated semiconductor chip is among the plurality of separated semiconductor chips and comprises a cut portion of the scribe lane and a cut portion of the fuse cell,
the cut portion of the fuse cell is in the cut portion of the scribe lane,
at least one of the second dummy structures is in the cut portion of the fuse cell and in an edge of the separated semiconductor chip,
the edge of the separated semiconductor chip includes a cut supplementary structure in the cut portion of the scribe lane.

15. The method of claim 11, wherein the fuse structure is configured to be programmed with a code.

16. A semiconductor chip, comprising:
a main chip;
a cut scribe lane on a first boundary of the main chip;
a cut fuse cell in the cut scribe lane, the cut fuse cell not being in the main chip; and
a connection structure extending from the cut fuse cell into the main chip,
the main chip including first dummy structures disposed around the connection structure,
the cut fuse cell including second dummy structures disposed around the connection structure, the main chip and the cut fuse cell defining a dummy-free region between the first dummy structures and the second dummy structures, and the dummy-free region overlapping the first boundary.

17. The semiconductor chip of claim 16, wherein the main chip comprises a plurality of functional elements, and each of the plurality of functional elements comprises a memory block, an analog logic block, an input/output (I/O) logic block, a central processing unit (CPU) block, or a radio frequency block.

18. The semiconductor chip of claim 17, wherein the connection structure is electrically connected to at least one of the plurality of functional elements.

19. The semiconductor chip of claim 16, wherein the cut scribe lane comprises a cut supplementary structure, at least one of the second dummy structures is disposed in an edge of the semiconductor chip, and the cut supplementary structure is disposed in the edge.

20. The semiconductor chip of claim 16, wherein a fuse structure, which is configured to be programmed with a code, is excluded from the cut fuse cell.

* * * * *